(12) United States Patent  
Sugawara et al.

(10) Patent No.: US 6,788,600 B2  
(45) Date of Patent: Sep. 7, 2004

(54) NON-VOLATILE SEMICONDUCTOR MEMORY

(75) Inventors: Hiroshi Sugawara, Tokyo (JP); Toshikatsu Jinbo, Tokyo (JP); Atsunori Miki, Tokyo (JP); Takayuki Kurokawa, Tokyo (JP); Kenichi Ushikoshi, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 85 days.

(21) Appl. No.: 10/139,716

(22) Filed: May 6, 2002

(65) Prior Publication Data

US 2002/0163033 A1 Nov. 7, 2002

(30) Foreign Application Priority Data

May 7, 2001 (JP) ........................................ 2001-135774

(51) Int. Cl.[7] ................................................ G11C 7/02
(52) U.S. Cl. .................................. 365/207; 365/230.03
(58) Field of Search ............................. 365/207, 230.03

(56) References Cited

U.S. PATENT DOCUMENTS 6,044,033 A * 3/2000 Jang ...................... 365/230.03

* cited by examiner

*Primary Examiner*—Thien F Tran  
(74) *Attorney, Agent, or Firm*—Darryl G. Walker; Bradley T. Sako

(57) ABSTRACT

A non-volatile flash memory (100) that may have an improved layout freedom is disclosed. Non-volatile flash memory (100) may include banks (B0 and B1). Each bank (B0 and B1) may include memory cell arrays (MCA00 to MCA03) including a plurality of memory cells (MC) connected to sub bit lines (LB). A plurality of sub bit lines (LB) may be selectively connected to a main bit line (MB) by a group switch (Y1S0 and Y1S1). A group of main bit lines (MB) may be disposed over a memory cell array. A group of main bit lines (MB) may be selectively connected to a sense amplifier block (SAB) by a group switch group (Y2S0 and Y2S1) and a bank switch group (Y3S0 and Y3S1). In this way, a sense amplifier block (SAB) may be shared by a plurality of groups of main bit lines (MB). In this way, layout freedom may be improved.

12 Claims, 8 Drawing Sheets

NON-VOLATILE SEMICONDUCTOR MEMORY

TECHNICAL FIELD

The present invention relates generally to a semiconductor memory and more particularly to a non-volatile semiconductor memory such as a non-volatile flash memory that may have an improved layout freedom.

BACKGROUND OF THE INVENTION

It is a continuing goal to improve layout freedom of semiconductor devices. By doing so, chip size may be reduced and thus, manufacturing costs may be reduced.

FIG. 9 is a block diagram illustrating a plan view of a conventional non-volatile flash memory and given the general reference character 900.

Conventional non-volatile flash memory 900 is divided into two banks (B0 and B1). Bank B0 has four memory cell arrays (MCA00 to MCA03) arranged in quadrants to form a rectangular shape in a plan view. Bank B1 has four memory cell arrays (MCA10 to MCA13) arranged in quadrants to form a rectangular shape in a plan view. Each memory cell array (MCA00 to MCA03 and MCA10 to MCA13) contains 512 local bit lines LB and 512 word lines (not illustrated in FIG. 9). Memory cells are formed at intersections of bit lines LB and word lines.

Bank B0 has main X decoders (XDEC10, XDEC11, and XDEC20), and sub X decoders (XSUB00 to XSUB03) that are used to select a word line. Bank B1 has main X decoders (XDEC12, XDEC13, and XDEC21), and sub X decoders (XSUB10 to XSUB13) that are used to select a word line. Each memory cell array (MCA00 to MCA03 and MCA10 to MCA13) has a switch group (Y1S0 to Y1S3) located at ends of bit lines LB and connect local bit lines LB to main bit lines MB. A driver (Y1D0 to Y1D3) is adjacent to and drives a switch group (YS0 to YS3). A switch group (Y3S0 and Y3S1) is located between sense amplifier blocks SAB and main bit lines MB. A driver (Y3D0 and Y3D1) is located next to and drives a switch group (Y3S0 and Y3S1).

Referring now to FIG. 10, a circuit schematic diagram illustrating memory cell arrays (MCA00 to MCA03) of bank B0 is set forth.

In order to avoid unduly cluttering the figure, FIG. 10 only illustrates sixteen local bit lines LB and four main bit lines MB for each memory cell array (MCA00 to MCA03) of bank B0. Actually, each memory cell array (MCA00 to MCA03) has 512 local bit lines LB and there are 128 main bit lines MB disposed over each memory cell array (MCA00 to MCA03).

As illustrated in FIG. 10, memory cells MC are formed at intersections of local bit lines LB and word lines WL. Switch group Y1S0 includes transistors Tr1. Every other local bit line LB in memory cell arrays (MCA00 and MCA01) has an end connected to a transistor Tr1. Switch group Y1S1 includes transistors Tr2. Every other local bit line LB in memory cell arrays (MCA00 and MCA01) has an upper end connected to a transistor Tr2. In this way, every local bit line LB has a lower end connected to a transistor (Tr1 or Tr2) in a switch group (Y1S0 and Y1S1). In switch group Y1S0, two transistors Tr1 are connected to a main bit line MB. In switch group Y1S1, two transistors Tr2 are connected to a main bit line MB. In this way, one of four local bit lines LB are selectively connected to one main bit line MB through switch groups (Y1S0 and Y1S1).

Gates of transistors Tr1 in each switch group Y1S0 are connected to a driver Y1D0 through signal lines (D10 and D11). Signal line D10 is connected to the gate of one-half of transistors Tr1 in switch group Y1S0. Signal line D10 is connected to the gate of the other one-half of transistors Tr1 in switch group Y1S0. Switch groups (Y1S1 to Y1S3) are arranged in a similar manner. Drivers (Y1D0 to Y1D3) are respectively arranged between adjacent switch groups (YLS0 to Y1S3).

Switch group Y3S0 is disposed between main bit lines MB and sense amplifier blocks SAB. Switch group Y3S0 includes transistors Tr4. Each main bit line MB is connected to a source/drain of a transistor Tr4. The other source/drain of transistor Tr4 is connected to a sense amplifier SA in sense amplifier block SAB. Driver Y3D0 is commonly connected to gates of transistors Tr4 through signal line D30. Although only four transistors Tr4 are illustrated in each switch group Y3S0, there are 128 transistors Tr4 in each switch group or one transistor Tr4 for each main bit line MB. Bank B1 is similarly configured as bank B1. In bank B1 switch groups Y3S1 include transistors Tr4 having gates commonly connected to a driver Y3D1 through a signal line.

Referring now to FIG. 9, a DQ pad PAD1 is provided as a data I/O terminal and is connected to each sense amplifier block SAB. An input pad PAD2 receives an address signal and control signal. Conventional non-volatile flash memory 900 also includes a peripheral circuit P1 (an address buffer, for example), a peripheral circuit P2 (a power source generation circuit, for example), and a peripheral circuit P3 (such as a read-out and write-in control circuit, for example).

In conventional non-volatile flash memory 900, memory cell arrays (MCA00, MCA01, MCA10, and MCA11) can be simultaneously accessed because each memory cell array (MCA00, MCA01, MCA10, and MCA11) is connected to 128 sense amplifiers SA in sense amplifier block SAB. The 512 sense amplifiers SA in the four sense amplifier blocks SAB can then output data via DQ pad PAD1.

In conventional non-volatile flash memory 900, the 512 sense amplifiers SA are arranged in a row along the word line direction. Accordingly, the layout can be restricted in this area. As an example, because each main bit line MB is connected to a sense amplifier SA in sense amplifier block SAB, the sense amplifier SA must have a layout pitch no greater than the pitch of adjacent main bit lines MB.

In view of the above discussion, it would be desirable to provide a semiconductor memory device such as a non-volatile semiconductor memory that may have an increased layout freedom.

SUMMARY OF THE INVENTION

According to the present embodiments, a non-volatile flash memory that may have an improved layout freedom is disclosed. A non-volatile flash memory may include a plurality of banks. Each bank may include a plurality of memory cell arrays including a plurality of memory cells connected to sub bit lines. A plurality of sub bit lines may be selectively connected to a main bit line by a group switch. A group of main bit lines may be disposed over a memory cell array. A group of main bit lines may be selectively connected to a sense amplifier block by a group switch group and a bank switch group. In this way, a sense amplifier block may be shared by a plurality of groups of main bit lines. In this way, layout freedom may be improved.

According to one aspect of the embodiments, a non-volatile semiconductor memory device may include a first and second bank. Each bank may include a first and second memory cell array. Each of the first and second memory cell array may include n×k sub bit lines. N first main bit lines may be disposed over the first memory cell array. Each first main bit line may be coupled to k sub bit lines in the first memory cell array by a first sub bit line selecting circuit. N second main bit lines may be disposed over the second memory cell array. Each second main bit line may be coupled to k sub bit lines in the second memory cell array by a second sub bit line selecting circuit. A first sense amplifier block may include n sense amplifiers. A first main bit line selecting circuit may be coupled between the n first main bit lines of the first bank and the first sense amplifier block. A second main bit line selecting circuit may be coupled between the n second main bit lines of the first bank and the first sense amplifier block. The first main bit line selecting circuit may provide an electrical connection between each of the n first main bit lines of the first bank and a corresponding one of the n sense amplifiers when enabled. The second main bit line selecting circuit may provide an electrical connection between each of the n second main bit lines of the first bank and a corresponding one of the n sense amplifiers when enabled.

According to another aspect of the embodiments, a non-volatile semiconductor memory may include a second sense amplifier block. The second sense amplifier block may include n sense amplifiers. A third main bit line selecting circuit may be coupled between the n first main bit lines of the second bank and the second sense amplifier block. A fourth main bit line selecting circuit may be coupled between the n second main bit lines of the second bank and the second sense amplifier block. The third main bit line selecting circuit may provide an electrical connection between each of the n first main bit lines of the second bank and a corresponding one of the n sense amplifiers of the second sense amplifier block when enabled. The fourth main bit line selecting circuit may provide an electrical connection between each of the n second main bit lines of the second bank and a corresponding one of the n sense amplifiers of the second sense amplifier block when enabled.

According to another aspect of the embodiments, a non-volatile semiconductor memory device may include a third main bit line selecting circuit coupled between the n first main bit lines of the second bank and the first sense amplifier block. A fourth main bit line selecting circuit may be coupled between the n second main bit lines of the second bank and the first sense amplifier block. A first bank selecting circuit may be coupled in series with the first main bit line selecting circuit. The first bank selecting circuit may provide an electrical connection between the first main bit lines of the first bank and the sense amplifier block when enabled. A second bank selecting circuit may be couple in series with the third bit line selecting circuit. The second bank selecting circuit may provide an electrical connection between the first main bit lines of the second bank and the sense amplifier block when enabled. The third main bit line selecting circuit may provide an electrical connection between each of the n first main bit lines of the second bank and a corresponding one of the n sense amplifiers of the first sense amplifier block when enabled. The fourth main bit line selecting circuit may provide an electrical connection between each of the n second main bit lines of the second bank and a corresponding one of the n sense amplifiers of the first sense amplifier block when enabled.

According to another aspect of the embodiments, the first main bit line selecting circuit may be distributed in a first part and a second part. The first part may be located in a first region essentially at a first end of the sub bit lines of the first memory cell array and the second part may be located in a second region essentially at a second end of the sub bit lines of the first memory cell array.

According to another aspect of the embodiments, a non-volatile semiconductor memory device may include a plurality of global bit lines coupled between the first main bit line selecting circuit and the first sense amplifier block. The plurality of global bit lines may be divided into a first group of global bit lines and a second group of global bit lines. The first group of global bit lines may be disposed in a direction essentially perpendicular to the first main bit lines and may be coupled to the first part of the first main bit line selecting circuit. The second group of global bit lines may be disposed in a direction essentially perpendicular to the first main bit lines and may be coupled to the second part of the first main bit line selecting circuit.

According to another aspect of the embodiments, the first sense amplifier block may be disposed between the first and second banks.

According to another aspect of the embodiments, at least one of the first group of global bit lines may be formed over the first part of the first main bit line selecting circuit. At least one of the second group of global bit lines may be formed over the second part of the main bit line selecting circuit.

According to another aspect of the embodiments, each of the first and second banks may further include a third and fourth memory cell array. Each of the third and fourth memory cell arrays may include n×k sub bit lines. The n first main bit lines may be disposed over the third memory cell array. Each first main bit line may be coupled to k sub bit lines in the third memory cell array by a third sub bit line selecting circuit. The n second main bit lines may be disposed over the fourth memory cell array. Each second main bit line may be coupled to k sub bit lines in the fourth memory cell array by a fourth sub bit line selecting circuit.

According to another aspect of the embodiments, a semiconductor memory device may include a plurality of first main bit lines, a plurality of second main bit lines, a plurality of first sub bit line groups, and a plurality of second sub bit line groups. Each first sub bit line group may include a plurality of first sub bit lines corresponding to one of the plurality of first main bit lines. Each second sub bit line group may include a plurality of second sub bit lines corresponding to one of the plurality of second main bit lines. Each of the first sub bit lines and second sub bit lines may be connected to a plurality of memory cells. A first global bit line may be coupled to one of the first main bit lines and to one of the second main bit lines. A second global bit line may be coupled to another one of the first main bit lines and another one of the second main bit lines. A first sense amplifier may be coupled to the first global bit line. A second sense amplifier may be coupled to the second global bit line.

According to another aspect of the embodiments, the plurality of first and second main bit lines may be disposed in a first direction. The first and second global bit lines may be disposed in a second direction and may be separated by at least the plurality of first sub bit line groups. The first and second sense amplifiers may be arranged in the first direction.

According to another aspect of the embodiments, the first direction may be orthogonal to the second direction. A first connection transistor may provide an electrical connection between the one of the first main bit lines and the first global bit line. A second connection transistor may provide an electrical connection between the another one of the first main bit lines and the second global bit line. The first connection transistor may be separated by at lest one of the plurality of memory cells in the first direction from the second connection transistor.

According to another aspect of the embodiments, the first and second connection transistors may be insulated gate filed effect transistors (IGFETs).

According to another aspect of the embodiments, a non-volatile semiconductor memory device may include a first and second bank. Each of the first and second bank may include a first and second memory cell array. Each of the first and second memory cell arrays may include a plurality of sub bit lines arranged in a plurality of groups of sub bit lines. A plurality of main bit lines may be disposed over each of the first and second memory cell array. Each one of the plurality of main bit lines may be coupled to one of the plurality of groups of sub bit lines by a sub bit line selecting circuit. Each one of the plurality of main bit lines may be coupled to one of a plurality of sense amplifiers by a main bit line selecting circuit. One of the plurality of main bit lines may be disposed over the first memory cell array in the first bank may be coupled to the same one of the plurality of sense amplifiers as one of the plurality of main bit lines disposed over the second memory cell array in the first bank.

According to another aspect of the embodiments, the one of the plurality of main bit lines disposed over the first memory cell array in the first bank is coupled to the same one of the plurality of sense amplifiers as one of the plurality of main bit lines disposed over the first memory cell array in the second bank and one of the plurality of main bit lines disposed over the second memory cell array in the second bank.

According to another aspect of the embodiments, a global bit line may be commonly coupled to the one of the plurality of main bit lines disposed over the first memory cell array in the first bank, the one of the plurality of main bit lines disposed over the second memory cell array in the first bank, the one of the plurality of main bit lines disposed over the first memory cell array in the second bank, and the one of the plurality of main bit lines disposed over the second memory cell array in the second bank.

According to another aspect of the embodiments, the plurality of sense amplifiers may be disposed between the first and second banks.

According to another aspect of the embodiments, the main bit line selection circuit may include a group selection circuit and a bank selection circuit coupled in series between the each one of the plurality of main bit lines and the one of the plurality of sense amplifiers.

According to another aspect of the embodiments, the bank selection circuit and group selection circuit may be responsive to at least a portion of an address received by the non-volatile semiconductor memory device.

According to another aspect of the embodiments, the bank selection circuit may include a first insulated gate field effect transistor (IGFET). The group selection circuit may include a second IGFET. The first and second IGFETs may be coupled in series to provide a controllable impedance path between the each one of the plurality of main bit lines and the one of the plurality of sense amplifiers.

According to another aspect of the embodiments, the non-volatile semiconductor memory device is a flash memory. The non-volatile semiconductor memory device includes at least one erase circuit.

DETAILED DESCRIPTION OF THE EMBODIMENTS

Various embodiments of the present invention will now be described in detail with reference to a number of drawings.

Figure 1:
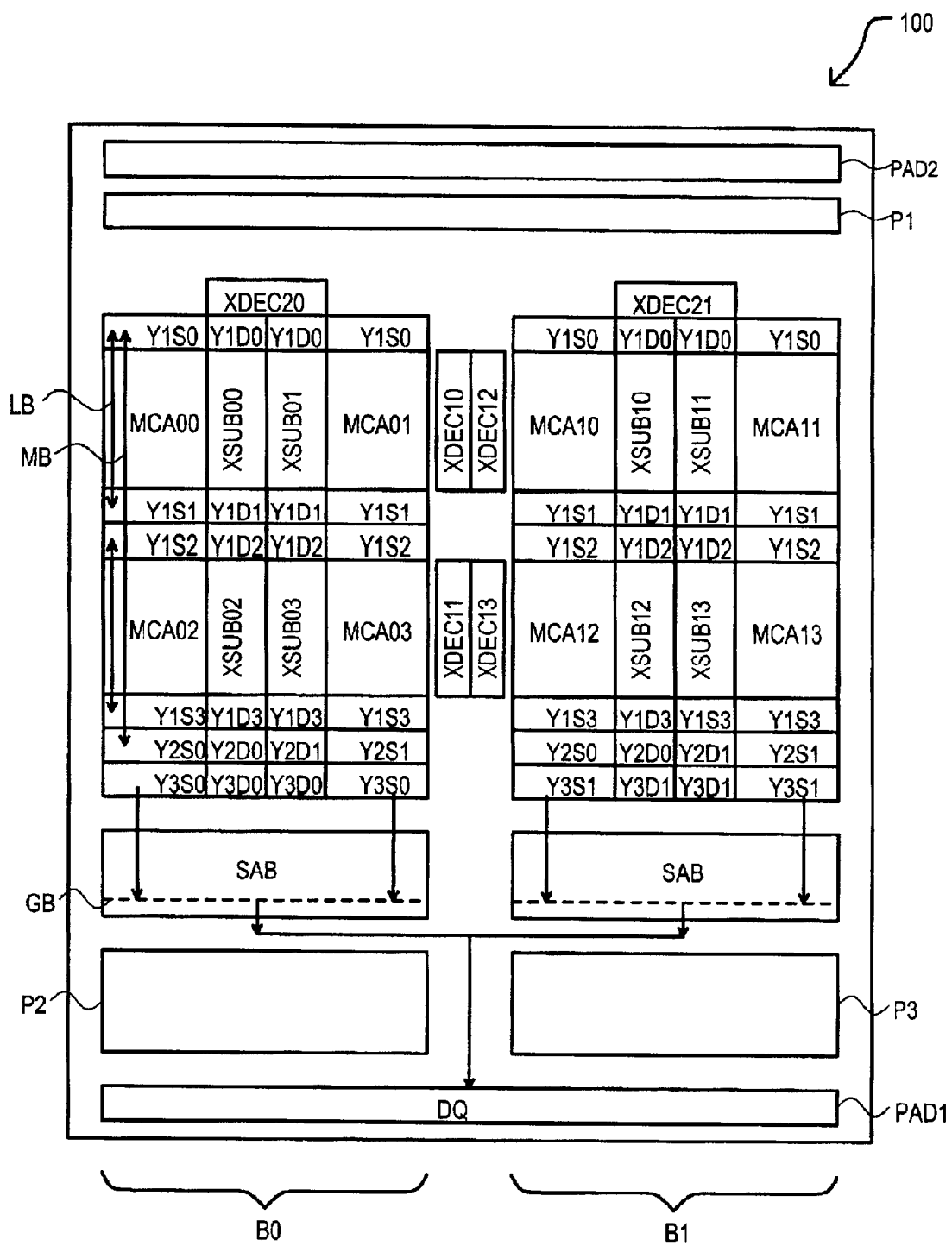
FIG. 1 is a block diagram illustrating a plan view of a non-volatile flash memory according to a first embodiment.

Referring now to FIG. 1, a block diagram illustrating a plan view of a non-volatile flash memory according to an embodiment and given the general reference character 100.

Non-volatile flash memory 100 may include two banks (B0 and B1). Bank B0 may include four memory cell arrays (MCA00 and MCA03). Memory cell arrays (MCA00 to MCA03) may be arranged in quadrants to form a rectangular shape in a plan view. Bank B1 may include four memory cell arrays (MCA10 and MCA13). Memory cell arrays (MCA10 to MCA13) may be arranged in quadrants to form a rectangular shape in a plan view.

Each memory cell array (MCA00 to MCA03 and MCA10 to MCA13) may include 512 local bit lines LB and 512 word lines (not illustrated in FIG. 1). Memory cells may be formed at intersections of bit lines LB and word lines.

Bank B0 may include main X decoders (XDEC10, XDEC11, and XDEC20) and sub X decoders (XSUB00 to XSUB03). Main X decoders (XDEC10, XDEC11, and XDEC20) and sub X decoders (XSUB00 to XSUB03) may be used activate to a word line.

Bank B1 may include main X decoders (XDEC12, XDEC13, and XDEC21) and sub X decoders (XSUB10 to XSUB13). Main X decoders (XDEC12, XDEC13, and XDEC21) and sub X decoders (XSUB10 to XSUB13) may be used to activate a word line.

Bit lines LB in each memory cell array (MCA00 to MCA03 and MCA10 to MCA13) may be connected to a switch group (Y1S0 to Y1S3) located at ends of bit lines LB. Switch groups (YS0 to YS3) may selectively connect local bit lines LB to main bit lines MB. A driver (Y1D0 to Y1D3) may be located next to a respective switch group (YS0 to YS3). A respective driver (Y1D0 to Y1D3) may select a respective switch group (YS0 to YS3).

Banks (B0 and B1) may also include switch groups (Y2S0 and Y2S1) disposed between switch groups Y1S3 and switch groups (Y3S0 and Y3S1). A driver (Y2D0 and Y2D1) may be located next to a respective switch group (Y2S0 and Y2S1). A respective driver (Y2D0 and Y2D1) may select a respective switch group (Y2S0 and Y2S1).

Bank B0 may also include switch groups Y3S0. Switch groups Y3S0 may be disposed between respective switch groups (Y2S0 and Y2S1) and sense amplifier block SAB. A global bus GB may connect respective switch groups Y3S0 to sense amplifier block SAB. Drivers Y3D0 may be located next to respective switch groups Y3S0. Respective driver Y3D0 may select respective switch groups Y3S0.

Bank B1 may also include switch groups Y3S1. Switch groups Y3S1 may be disposed between respective switch groups (Y2S0 and Y2S1) and sense amplifier block SAB. A global bus GB may connect respective switch groups Y3S1 to sense amplifier block SAB. Driver Y3D1 may be located next to respective switch groups Y3S1. Respective drivers Y3D1 may select respective switch groups Y3S1.

Sense amplifier blocks SAB can provide an output to a DQ pad PAD1. It is noted that although only one DQ pad PAD1 is illustrated, a plurality of DQ pads PAD1 may be provided. In this way, a plurality of data bits may be simultaneously accessed external to the device.

Non-volatile flash memory 100 may also include an input pad PAD2. Input pad PAD2 may receive address and control signals, as just two examples. Input pad PAD2 may include a plurality of input pads such that control signals and addresses may be received in parallel.

Non-volatile flash memory 100 may also include peripheral circuits (P1 to P3). Peripheral circuit P1 may include input buffers, such as address and control input buffers, as just a few examples. Peripheral circuit P2 may include power source generation circuits, as just an example. Peripheral circuit P3 may include read-out, write-in, and control circuitry, as just a few examples.

Figure 2:
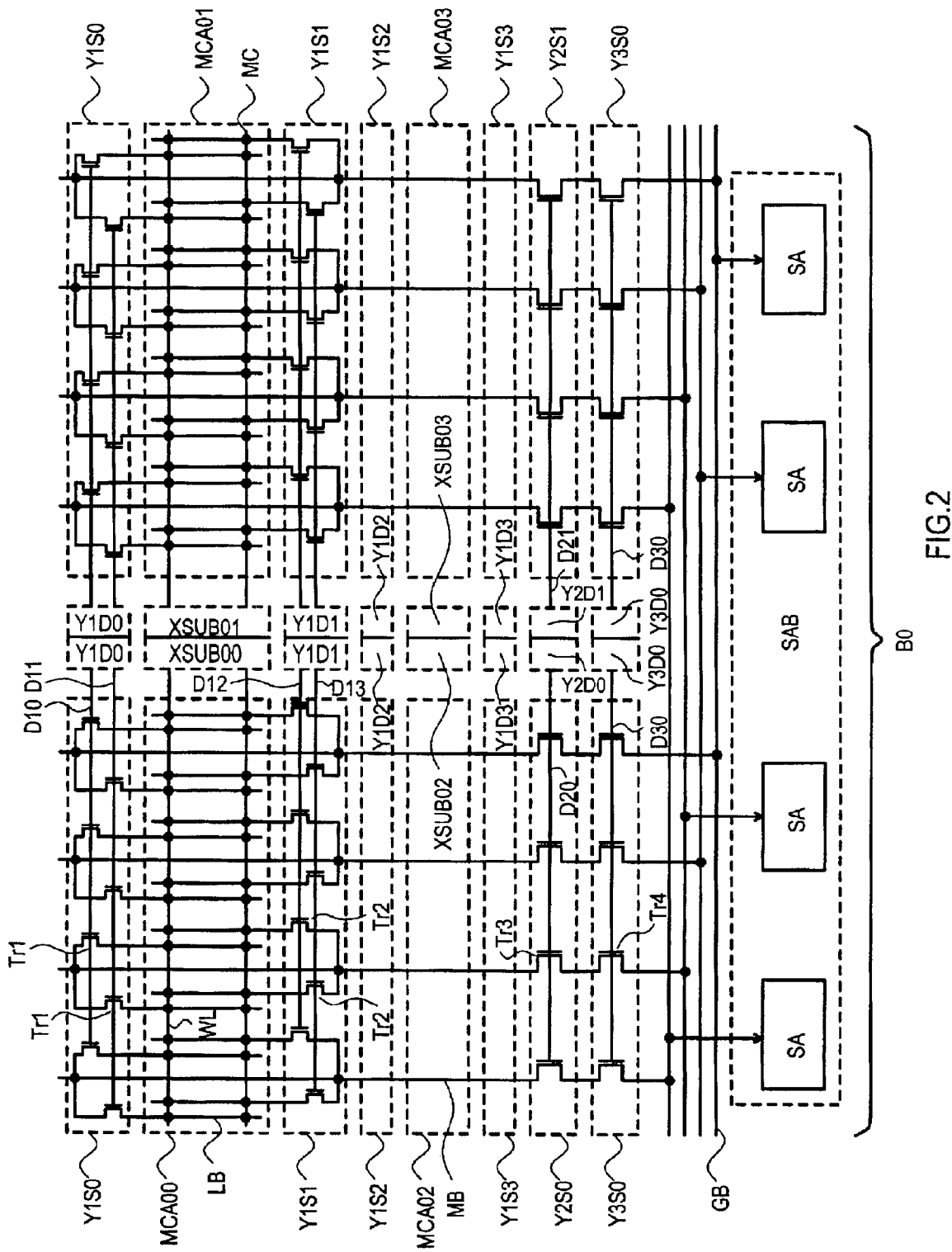
FIG. 2 is a circuit schematic diagram illustrating various circuits in a bank of a non-volatile flash memory according to the first embodiment.

Referring now to FIG. 2, a circuit schematic diagram illustrating various circuits in a bank B0 of a non-volatile flash memory 100 according to an embodiment is set forth.

In order to avoid unduly cluttering the figure, FIG. 2 only illustrates sixteen local bit lines LB and four main bit lines MB for each memory cell array (MCA00 to MCA03) of bank B0. Although only sixteen local bit lines LB are illustrated, each memory cell array (MCA00 to MCA03) may include 512 local bit lines LB. Also, although there are only four main bit lines LB illustrated, 128 main bit lines MB may be disposed over each memory cell array (MCA00 to MCA03). Memory cells MC may be formed at intersections of local bit lines LB and word lines WL.

In memory cell array MCA00, one-half of local bit lines LB may be connected to switch group Y1S0 and the other one-half of local bit lines LB may be connected to switch group Y1S1. Switch group Y1S0 may include transistors Tr1 and switch group Y1S1 may include transistors Tr2. Each transistor Tr1 in switch group Y1S0 may have a source/drain connected to a respective local bit line LB and the other source/drain connected to a main bit line MB. Two transistors Tr1 may have source/drains commonly connected t the same main bit line MB. Likewise, each transistor Tr2 in switch group Y1S1 may have a source/drain connected to a respective local bit line LB and the other source/drain connected to a main bit line MB. Two transistors Tr2 may have source/drains commonly connected to the same main bit line MB. In this way, two transistors Tr1 and two transistors Tr2 in respective switch groups (Y1S0 and Y1S1) may provide a selection of one of four local bit lines LB to be connected to a main bit line MB. Thus, switch groups (Y1S0 and Y1S1) may provide a four to one multiplexing function to select one of four local bit lines LB.

Switch group Y1S0 may receive selection signals (D10 and D11) from driver Y1D0. Select ion signals (D10 and D11) may each be connected to one-half of transistors Tr1 in a way so that of the two transistors Tr1 connected to the same main bit line MB, each transistor Tr1 may receive one of selection signals (D10 and D11). Likewise, switch group Y1S1 may receive selection signals (D12 and D13) from driver Y1D1. Selection signals (D12 and D13) may each be connected to one-half of transistors Tr2 in a way so that of the two transistors Tr2 connected to the same main bit line MB, each transistor Tr2 may receive one of selection signals (D12 and D13).

Although only eight transistors Tr1 and eight transistors Tr2 are illustrated, it is noted that there may be half the number of transistors Tr1 as local bit lines LB in memory cell array MCA00 and half the number of transistors Tr2 as local bit lines LB in memory cell array MCA00. Thus, there may be 256 transistors Tr1 and 256 transistors Tr2, as just an example.

In a similar manner, switch groups (Y1S2 and Y1S3) may select one of four local bit lines LB in memory cell array MCA02. Likewise, switch groups (Y1S0 and Y1S1) may select one of four local bit lines LB in memory cell array MCA01 and switch groups (Y1S2 and Y1S3) may select one of four local bit lines LB in memory cell array MCA03.

Drivers Y1D2 may be disposed between and may provide selection signals to switch groups Y1S2. Drivers Y1D3 may be disposed between and may provide selection signals to switch groups Y1S3.

Referring still to FIG. 2, a switch group Y2S0 may be disposed between main bit lines MB of memory cell arrays (MCA00 and MCA02) and a switch group Y3S0. Switch group Y2S0 may include transistors Tr3. There may be one transistor Tr3 for each main bit line MB. Only four transistors Tr3 are illustrated in FIG. 2 in order to avoid unduly cluttering up the figure. In reality there may be 128 transistors Tr3. Each transistor Tr3 may have a source/drain connected to a main bit line MB, another source/drain connected to a transistor Tr4 in switch group YS30 and a gate connected to a driver Y2D0 through a signal line D30.

A switch group Y2S1 may be disposed between main bit lines MB of memory cell arrays (MCA01 and MCA03) and a switch group Y3S0 in a similar manner. A driver Y2D1 may be connected to gates of transistors in switch group Y2S1 through signal line D21.

Drivers (Y2D0 and Y2D1), respectively, may be disposed adjacent to respective switch groups (Y2S0 and Y2S1).

A switch group Y3S0 may be disposed between switch group Y2S0 and sense amplifier block SAB. Switch group Y3S0 may include transistors Tr4. Each transistor Tr4 may have a source/drain connected to a source/drain of a transistor Tr3 in switch group Y2S0 and another source/drain connected to a global bit line GB. Transistors Tr4 may have a gate commonly connected to a driver Y3D0 through signal line D30. Although only four transistors Tr4 are shown, there may be the same number of transistors Tr4 as main bit lines MB.

A switch group Y3S0 may be disposed between switch group Y2S1 and sense amplifier block SAB in a similar manner. A driver Y3D0 may be connected to gates of transistors in switch group Y3S0 through signal line D30.

Global bit lines GB may be connected to sense amplifier block SAB. Sense amplifier block SAB may include sense amplifiers SA. Each global bit line GB may be connected to a sense amplifier SA. There may be a same number of sense amplifiers SA in sense amplifier block SB as global bit lines GB. There may be the same number of sense amplifiers SAB as main bit lines over, for example, memory cell arrays (MCA00 and MCA02) or memory cell arrays (MCA01 and MCA03).

Figure 3:
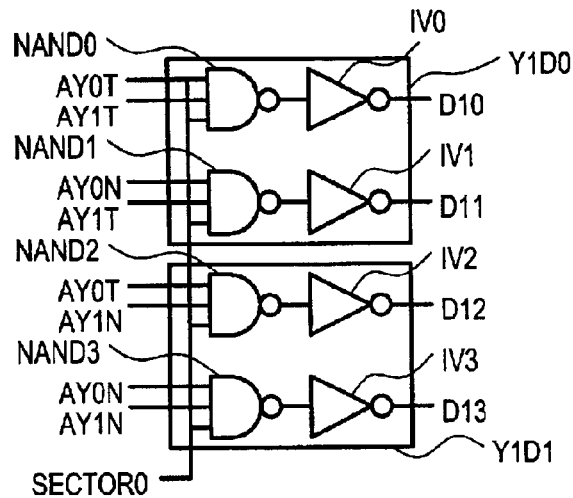
FIG. 3 is a circuit schematic diagram of drivers according to an embodiment.

Referring now to FIG. 3, a circuit schematic diagram of drivers (Y1D0 and Y1D1) according to an embodiment is set forth.

Driver Y1D0 may include NAND gates (NAND0 and NAND1), and inverters (IV0 and IV1). NAND gate NAND0 may receive bit line selecting signals (AY0T and AY1T) and a sector selecting signal SECTOR0 at inputs and may have an output connected to an input of inverter IV0. Inverter IV0 may output a decode signal D10. NAND gate NAND1 may receive bit lie selecting signals (AY0N and AY1T) and a sector selecting signal SECTOR0 at inputs and may have an output connected to an input of inverter IV1. Inverter IV1 may output a decode signal D11.

Driver Y1D1 may include NAND gates (NAND2 and NAND3), and inverters (IV2 and IV3). NAND gate NAND2 may receive bit line selecting signals (AY0T and AY1N) and a sector selecting signal SECTOR0 at inputs and may have an output connected to an input of inverter IV2. Inverter IV2 may output a decode signal D12. NAND gate NAND3 may receive bit line selecting signals (AY0N and AY1N) and a sector selecting signal SECTOR0 at inputs and may have an output connected to an input of inverter IV3. Inverter IV3 may output a decode signal D13.

Selecting signals (AY0N and AY0N) and selecting signals (AY1T and AY1N) may be complementary address signals, as just one example. Sector selecting signal SECTOR0 may be active (high in this case) when any of memory cell arrays (MCA00, MCA01, MCA10, or MCA11) are selected. Sector selecting signal may be conceptualized as an enable signal. When sector selecting signal SECTOR0 is active (high), one of decode signals (D10 to D13) may become high, while the other three of decode signals (D10 to D13) may be low. If bit line selecting signals (AY0T and AY1T) are both high, decode signal D10 may be high. If bit line selecting signals (AY0N and AY1T) are both high, decode signal D11 may be high. If bit line selecting signals (AY0T and AY1N) are both high, decode signal D12 may be high. If bit line selecting signals (AY0N and AY1N) are both high, decode signal D13 may be high.

Decode signals (D10 to D11) may be supplied to switch group Y1S0. Decode signals (D12 to D13) may be supplied to switch group Y1S1. In this way, one of four local bit lines (LB) may be selected in accordance with a vale of bit line selecting signals (AY0T, AY0N, AY1T, and AY1N).

Drivers (Y1D2 and Y1D3) may have a similar configuration to drivers (Y1D0 and Y1D1), respectively. However, NAND gates in drivers (Y1D2 and Y1D3) may be enabled by a sector selecting signal SECTOR1. Sector selecting signal SECTOR1 may be active (high in this case) when any of memory cell arrays (MCA02, MCA03, MCA12, or MCA13) are selected.

Each main bit line MB may be connected to a source/drain of a transistor Tr3 in switch groups (Y2S0 and Y2S1). In bank B0, memory cell arrays (MCA00 and MCA02) may share the same main bit lines MB. In this case, they may share 128 main bit lines MB. Likewise, memory cell arrays (MCA01 and MCA03) may share the same main bit lines MB. In this case, they may share 128 main bit lines MB. Switch circuits (Y2S0 and Y2S1) may respectively be disposed between main bit lines MB and switch circuits Y3S0. In this way, switch circuits (Y2S0 and Y2S1) may select either the group of main bit lines MB shared by memory cell arrays (MCA00 and MCA02) or the group of main bit lines MB shared by memory cell arrays (MCA01 and MCA03). This selection may be done in accordance with decode signals (D20 and D21). Decode signals (D20 and D21) may respectively be generated by drivers (Y2D0 and Y2D1).

Figure 4:
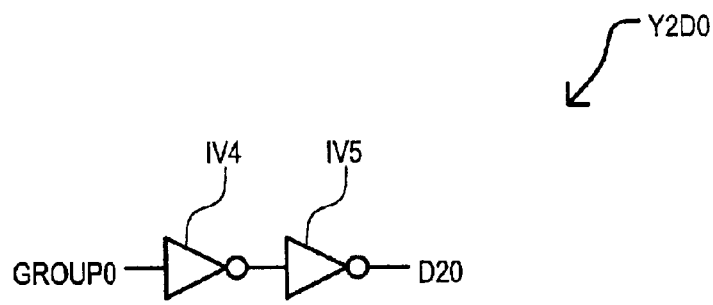
FIG. 4 is a circuit schematic diagram of a driver according to an embodiment.

Referring now to FIG. 4, a circuit schematic diagram of driver Y2D0 according to an embodiment is set forth.

Driver Y2D0 may include inverters (IV4 and IV5). Inverter IV4 may receive a group selecting signal GROUP0 and may provide an output as an input to inverter IV5. Inverter IV5 may provide a decode signal D20 as an output. Group selecting signal GROUP0 may become active (high, in this case) when either one of memory cell arrays (MCA00 or MCA02) are selected.

Driver Y2D1 have a similar configuration to driver Y2D0. However, driver Y2D1 may receive a group selecting signal GROUP1 as an input and may provide a decode signal D21 as an output. Group selecting signal GROUP1 may become active (high, in this case) when either one of memory cell arrays (MCA01 or MCA03) are selected.

In bank B1, switch groups (Y2S0 and Y2S1) and drivers (Y2D0 and Y2D1) may be similarly arranged.

A switch group Y3S0 may be connected between switch group Y2S0 and sense amplifier block SAB. Likewise, a switch group Y3S0 may be connected between switch group Y2S1 and sense amplifier block SAB. Transistors Tr4 within switch group Y3S0 may provide a controllable impedance path between outputs of switch groups (Y2S0 and Y2S1) and sense amplifier block SAB. Each switch group Y3S0 may be connected to a driver Y3D0.

Figure 5:
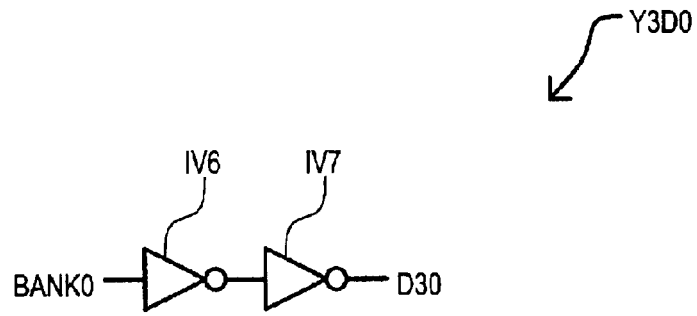
FIG. 5 is a circuit schematic diagram of a driver according to an embodiment.

Referring now to FIG. 5, a circuit schematic diagram of driver Y3D0 according to an embodiment is set forth.

Driver Y3D0 may include inverters (IV6 and IV7). Inverter IV6 may receive a bank selecting signal BANK0 and may provide an output to an input of inverter IV7. Inverter IV7 may provide decode signal D30 as an output. Bank selecting signal BANK0 may become active (high, in this case) when bank B0 is selected. When bank selecting signal BANK0 becomes active, decode signal D30 may become active (high in this case).

Driver Y3D1 in bank B1 may be configured similarly to driver Y3D0 in bank B1. However, driver Y3D1 may receive a bank selecting signal BANK1. Bank selecting signal BANK1 may become active (high, in this case) when bank B1 is selected. In a similar manner, each group switch Y3S1 may be connected to a driver Y3D1.

Global bit lines GB may provide an electrical connection between switch groups Y3S0 and sense amplifier buffer SAB. In this way, global bit lines GB may selectively provide an electrical connection between sense amplifier buffer SAB and main bit lines MB shared by memory cell arrays (MCA00 and MCA02) or main bit lines MB shared by memory cell arrays (MCA01 and MCA03). There may be 128 global bit lines GB. Each global bit line GB may be connected to a source/drain of one transistor Tr4 within a group switch Y3S0. Each global bit line GB may also be connected to one sense amplifier SA within sense amplifier block SAB. There may be 128 sense amplifiers SA within a sense amplifier block SAB.

In bank B1, global bit lines GB and a sense amplifier block SAB may be similarly arranged. However, in bank B1, global bit lines may be connected to a group switch Y3S1, which may be selectable in accordance with a bank selection signal BANK1.

It should be noted that although FIG. 2 illustrates global bit lines GB as being disposed between sense amplifier block SAB and switch group Y3S0, global bit lines GB may be disposed over sense amplifier block SAB in a conductive layer, such as a metal layer. In this way, chip area may be reduced.

A DQ pad PAD1 may be provided as a data I/O terminal connected to an output terminal of each sense amplifier SA.

Non-volatile flash memory 100 may also include an input pad PAD2. Input pad PAD2 may receive address and control signals, as just two examples. Input pad PAD2 may include a plurality of input pads such that control signals and addresses may be received in parallel.

Non-volatile flash memory 100 may also include peripheral circuits (P1 to P3). Peripheral circuit P1 may include input buffers, such as address and control input buffers, as just a few examples. Peripheral circuit P2 may include power source generation circuits, as just an example. Peripheral circuit P3 may include read-out, write-in, and control circuitry, as just a few examples.

Bank B0 may include main X decoders (XDEC10, XDEC11, and XDEC20) and sub X decoders (XSUB00 to XSUB03). Main X decoders (XDEC10, XDEC11, and XDEC20) and sub X decoders (XSUB00 to XSUB03) may be used activate to a word line.

Bank B1 may include main X decoders (XDEC12, XDEC13, and XDEC21) and sub X decoders (XSUB10 to XSUB13). Main X decoders (XDEC12, XDEC13, and XDEC21) and sub X decoders (XSUB10 to XSUB13) may be used to activate a word line.

Main X decoder XDEC10 may be adjacent to memory cell array MCA01. Main X decoder XDEC10 may be used to select a main word line (not shown) out of a plurality of main word lines for memory cell arrays (MCA00 and MCA01). The main word lines may be connected to sub X decoders (XSUB00 and XSUB01). Main X decoder XDEC11 may be adjacent to memory cell array MCA03. Main X decoder XDEC11 may be used to select a main word line (not shown) out of a plurality of main word lines for memory cell arrays (MCA02 and MCA03). The main word lines may be connected to sub X decoders (XSUB02 and XSUB03). Main X decoder XDEC12 may be adjacent to memory cell array MCA10. Main X decoder XDEC12 may be used to select a main word line (not shown) out of a plurality of main word lines for memory cell arrays (MCA10 and MCA11). The main word lines may be connected to sub X decoders (XSUB10 and XSUB11). Main X decoder XDEC10 may be adjacent to memory cell array MCA01. Main X decoder XDEC13 may be used to select a main word line (not shown) out of a plurality of main word lines for memory cell arrays (MCA00 and MCA01). The main word lines may be connected to sub X decoders (XSUB12 and XSUB13).

Main X decoder XDEC20 may be located at the opposite end of bank B0 as sense amplifier buffer SAB. Main X decoder XDEC20 may provide sub word line selection signals for sub X decoders (XSUB00 to XSUB03). For example, main X decoder XDEC20 may function to select one of every n sub-word lines.

Main X decoder XDEC21 may be located at the opposite end of bank B1 as sense amplifier buffer SAB. Main X decoder XDEC21 may provide sub word line selection signals for sub X decoder (XSUB10 to XSUB13).

Sub X decoder XSUB00 may be disposed adjacent to memory cell array MCA00. Sub X decoder XSUB00 may select one of a plurality of sub word lines (not shown) in memory cell array MCA00. In a similar manner, sub X decoders (XSUB01 to XSUB03 and XSUB10 to XSUB13), respectively, may be disposed adjacent to a respective memory cell array (MCA01 to MCA03 and MCA10 to MCA13) and may select a respective one of a plurality of sub word lines (not shown).

An explanation of the operation of non-volatile flash memory 100 will now be given with reference to FIGS. 1 and 2.

In the explanation, it is assumed that memory cells in memory cell array MCA00 are to be accessed. However, accesses to other memory cell arrays may be done in a similar manner.

An address may be received at input pad PAD2. An address buffer may provide main X decoders (XDEC10 and XDEC20), drivers (such as Y1D0, Y2D0, and Y3D0, etc.), and the like, with at least a portion of the received address.

Main X decoder XDEC10 may activate one main word line of a plurality of main word lines connected to sub X decoders (XSUB00 and XSUB01). The activated main word line and sub word line selection signals provided by main X decoder XDEC20 may cause sub X decoder XSUB00 to activate one of a plurality of sub word lines in memory cell array MCA00. In this way, data may be provided from a row of memory cells selected by the active sub word line to local bit lines LB in memory cell array MCA00.

Drivers (Y1D0 and Y1D1) may receive an active sector select signal SECTOR0 and thus may be enabled. Drivers (Y1D0 and Y1D1) may activate one to D11) in accordance with logic values of address signals (AY0T–AY0N and AY1T–AY1N). In this way, one of four local bit lines LB in memory cell array MCA00 may be connected to a main bit line MB through a switch circuit (Y1S0 or Y1S1). By doing so, data may be provided from one out of four local bit lines LB to main bit lines MB. It should be noted that sector select signal SECTOR1 may be inactive (low), thus drivers (Y1D2 and Y1D3) may remain disabled.

Driver Y2D0 may receive an active group select signal GROUP0. Driver Y2D0 may generate a decode signal D20 having an active level (high). In this way, all of transistors Tr3 in switch circuit Y2S0 may be turned on. It is noted, that driver Y2D1 may receive an inactive group select signal GROUP1. Driver Y2D1 may generate a decode signal D21 having an inactive level (low). In this way, all of transistors Tr3 in switch circuit Y2S1 may be turned off.

Driver Y3D0 may receive an active bank select signal BANK0. Driver Y3D0 may generate a decode signal D30 having an active level (high). Thus, all of transistors Tr4 in switch circuit Y3S0 may be turned on. With all of transistors Tr4 in switch circuit Y3S0 turned on, and all of transistors Tr3 in switch circuit Y2S0 turned on, data on main bit lines MB over memory cell arrays (MCA00 and MCA02) may be transmitted to global bit lines GB. In this way, sense amplifiers SA in sense amplifier block SAB may be supplied data from memory cell array MCA00.

It is noted, switch circuit Y3S0 connected to switch circuit Y2S1 may also have all transistors turned on. However, because all transistors in driver circuit Y2S1 are turned off, a data path to main bit lines MB over memory cell arrays (MCA01 and MCA03) may be disabled.

Data from sense amplifiers SA in sense amplifier block SAB may then be provided to DQ pad PAD1.

By sharing sense amplifiers SA between adjacent groups of main bit lines MB shared by memory cell arrays (MCA00–MCA02 and MCA01–MCA03), the number of sense amplifiers SA may be reduced by essentially one-half. By doing so, a sense amplifier may be laid out to a pitch of two main bit lines MB and thus, the layout may have more freedom. Also, due to a decrease in a number of sense amplifiers SA, chip size may be reduced.

Figure 6:
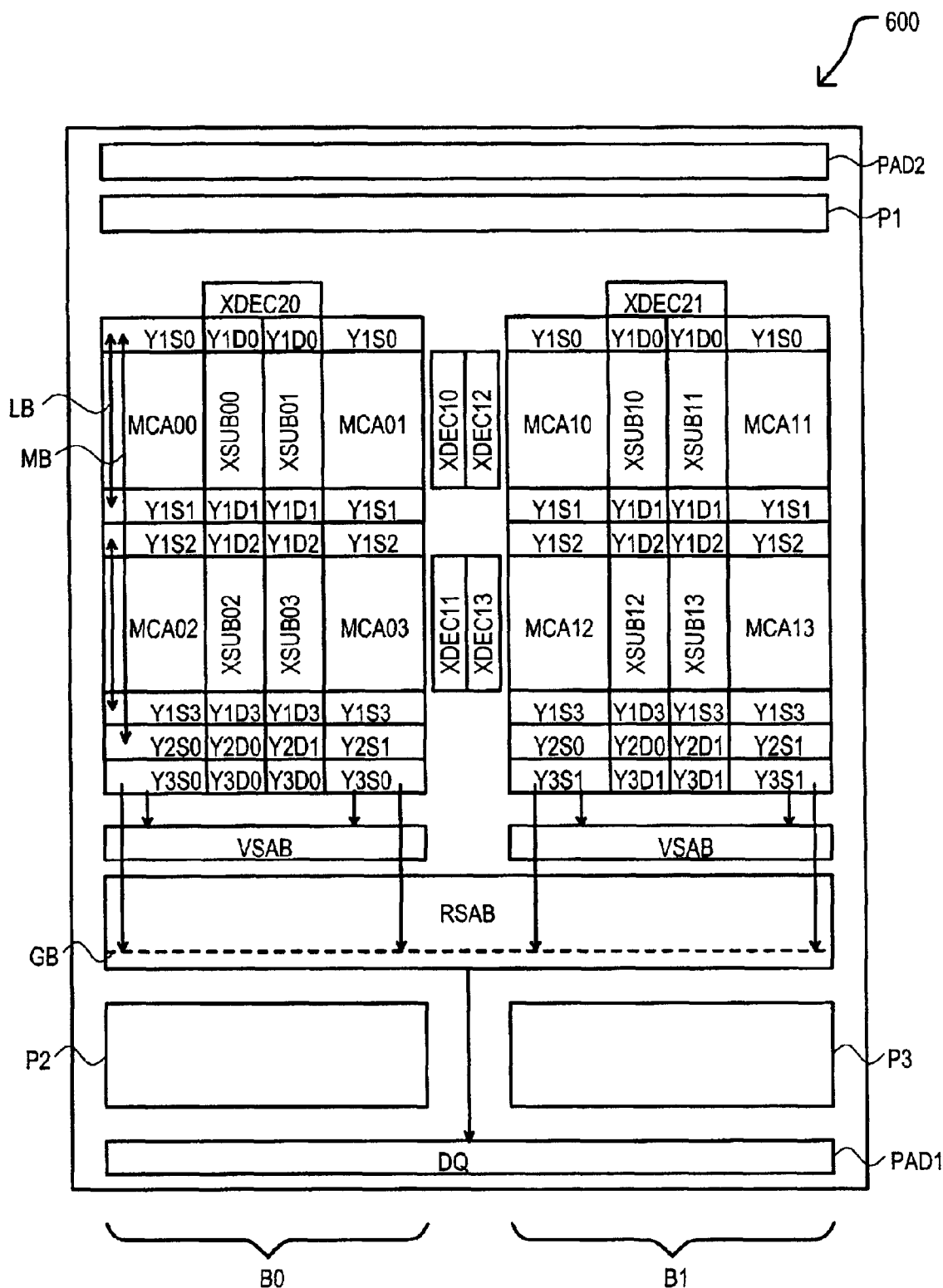
FIG. 6 is a block diagram illustrating a plan view of a non-volatile flash memory according to a second embodiment.

An explanation of a second embodiment of the present invention will now be given. FIG. 6 is a block diagram illustrating a plan view of a non-volatile flash memory according to a second embodiment and given the general reference character 600.

Non-volatile flash memory 600 may include similar constituents as non-volatile flash memory 100 and such constituents may be referred to by the same reference character and an explanation of such constituents may be omitted.

In non-volatile flash memory 600, main bit lines MB from banks (B0 and B1) may be connected to a read sense amplifier block RSAB through global bit lines GB. Read sense amplifier block RSAB may include 128 read sense amplifiers.

Non-volatile flash memory 600 may also include write/erase amplifier blocks VSAB. Each bank (B0 and B1) may include a write/erase amplifier block VSAB. Each write/erase amplifier block VSAB may include 16 write/erase amplifiers.

By sharing the same global bit lines GB between banks (B0 and B1), banks (B0 and B1) may share the same read sense amplifier block RSAB. By doing so, non-volatile flash memory 600 may have one-half the number of sense amplifiers as non-volatile flash memory 100. There may be no operating condition in which data is simultaneously read from both banks (B0 and B1). Because switch groups (Y2S0 and Y2S1) may be enabled by drivers (Y2D0 and Y2D1) according to group selecting signals (GROUP0 and GROUP1) and switch groups (Y3S0 and Y3S1) may be enabled by drivers (Y3D0 and Y3D1) according to bank selecting signals (BANK0 and BANK1), a global bit line GB may never be simultaneously connected to a plurality of main bit lines MB. In this way, a normal data read operation may be performed. Thus, the layout freedom of non-volatile flash memory 600 may be further improved over the layout freedom of non-volatile flash memory 100.

Also, because a write/erase sense amplifier block VSAB is provided for each bank (B0 and B1), it may be possible to perform data erase or write operation in one bank (B0 or B1) while performing a data read operation from the other bank (B0 or B1).

It should be noted that the number of write/erase amplifiers in each write/erase amplifier block VSAB is not limited to 16, the number may vary in accordance with the number of data bits desired to be simultaneously written into a bank (B0 and B1). However, in order to increase layout freedom, the smallest number allowable should be used.

Figure 7:
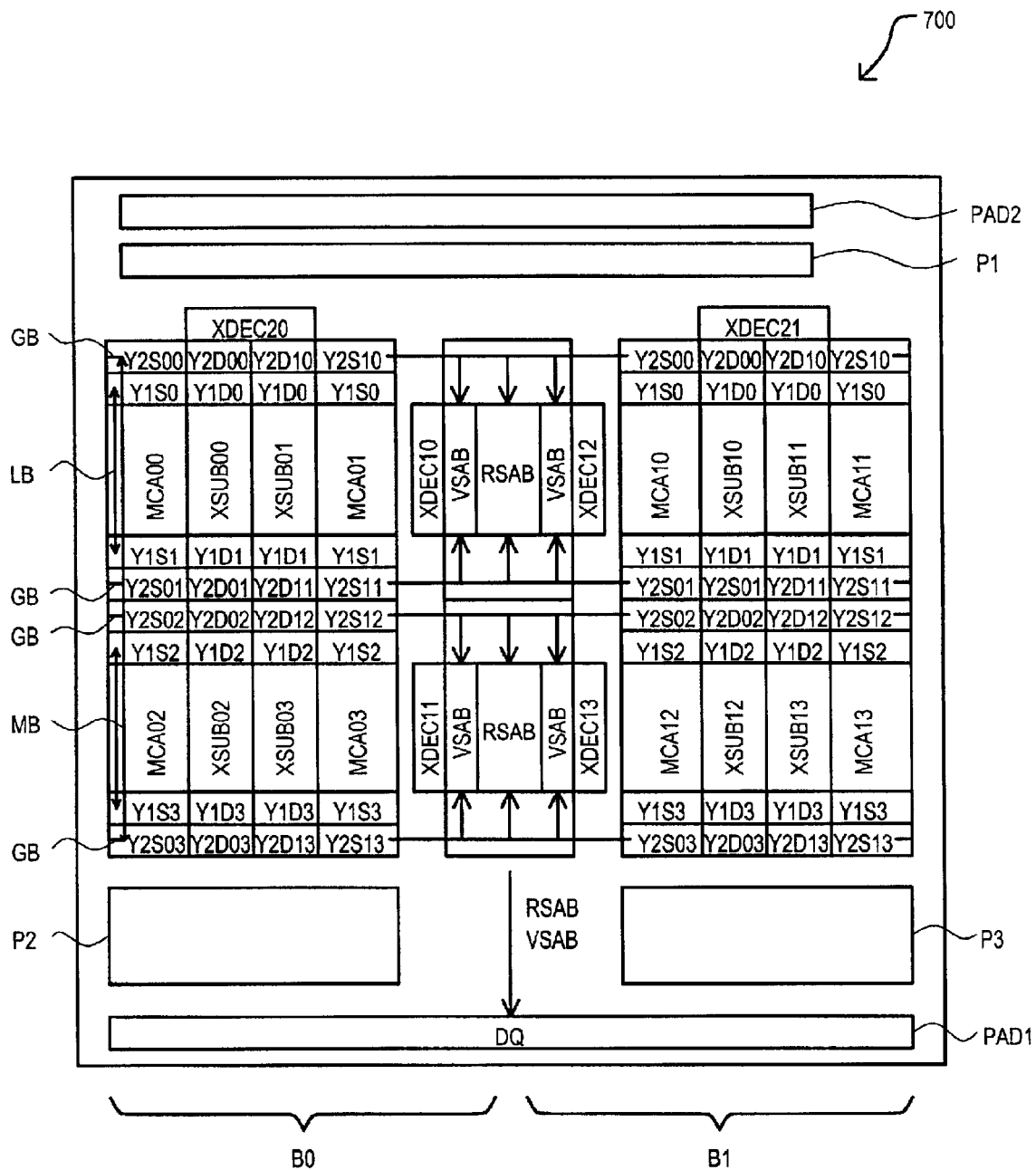
FIG. 7 is a block diagram illustrating a plan view of a non-volatile flash memory according to a third embodiment.

An explanation of a third embodiment of the present invention will now be given. FIG. 7 is a block diagram illustrating a plan view of a non-volatile flash memory according to a third embodiment and given the general reference character 700.

Non-volatile flash memory 700 may include similar constituents as non-volatile flash memory 100 and such constituents may be referred to by the same reference character and an explanation of such constituents may be omitted.

Figure 8:
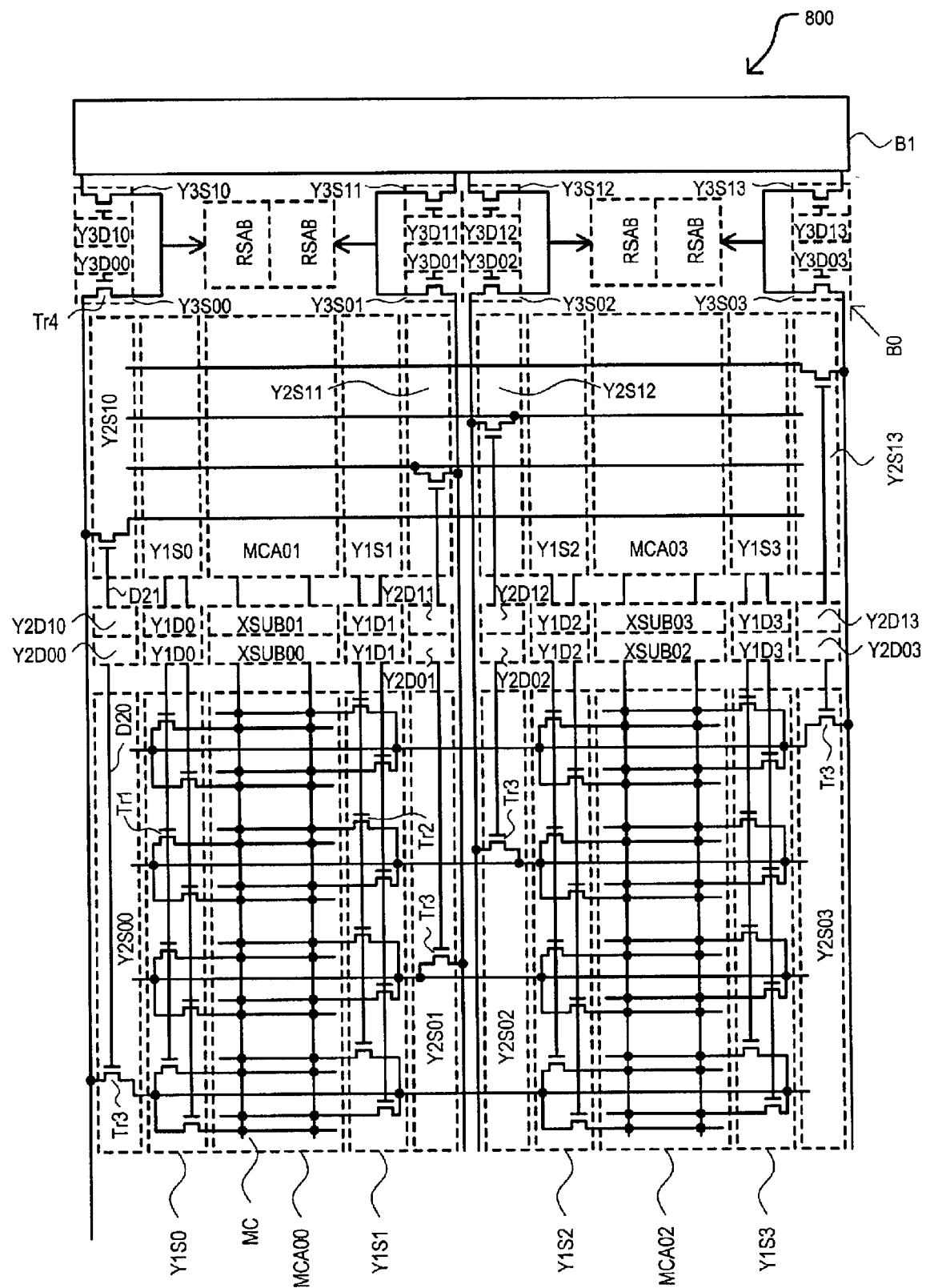
FIG. 8 is a circuit schematic diagram illustrating various circuits in a bank of a non-volatile flash memory according to the third embodiment.
Figure 9:
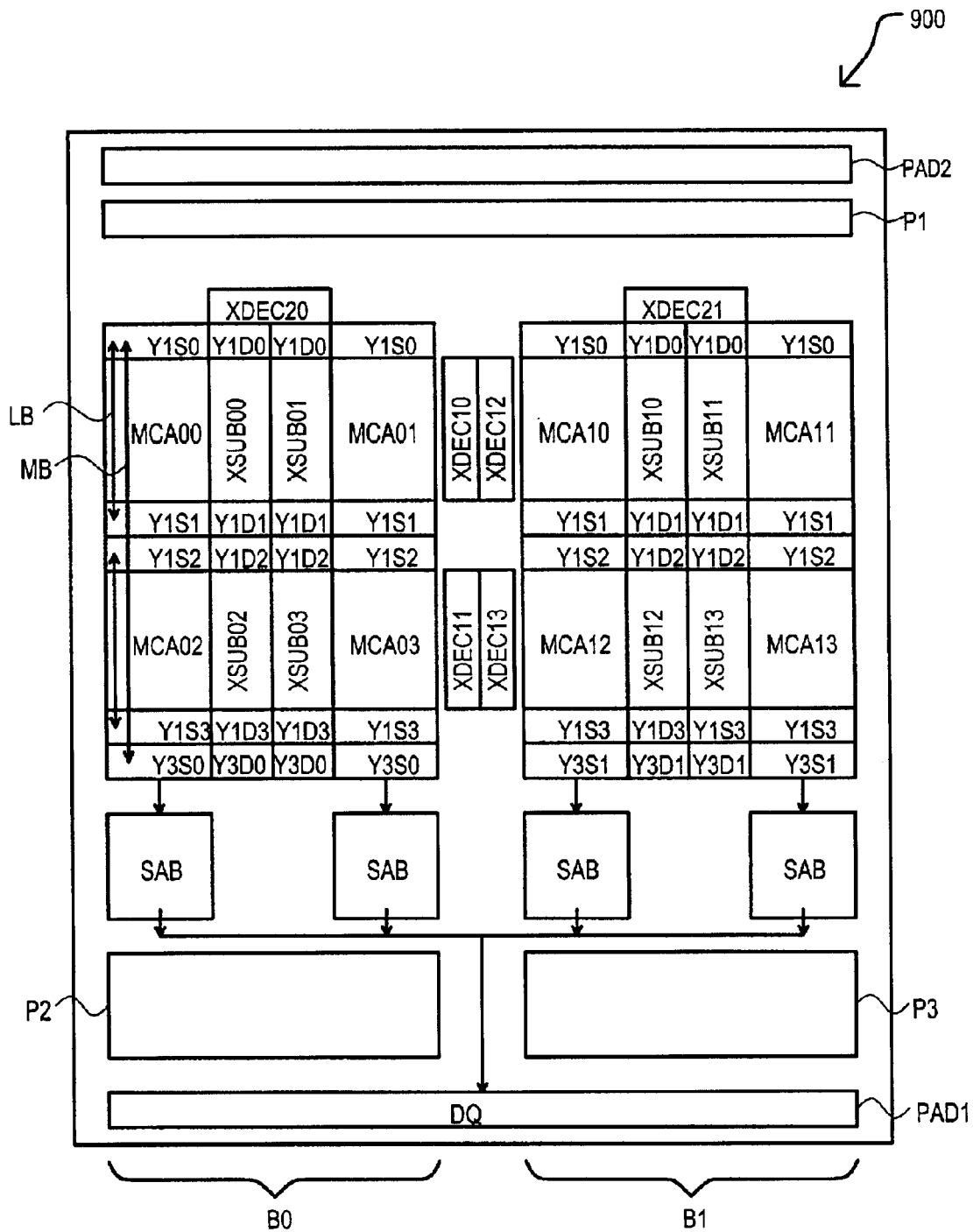
FIG. 9 is a block diagram illustrating a plan view of a conventional non-volatile flash memory.
Figure 10:
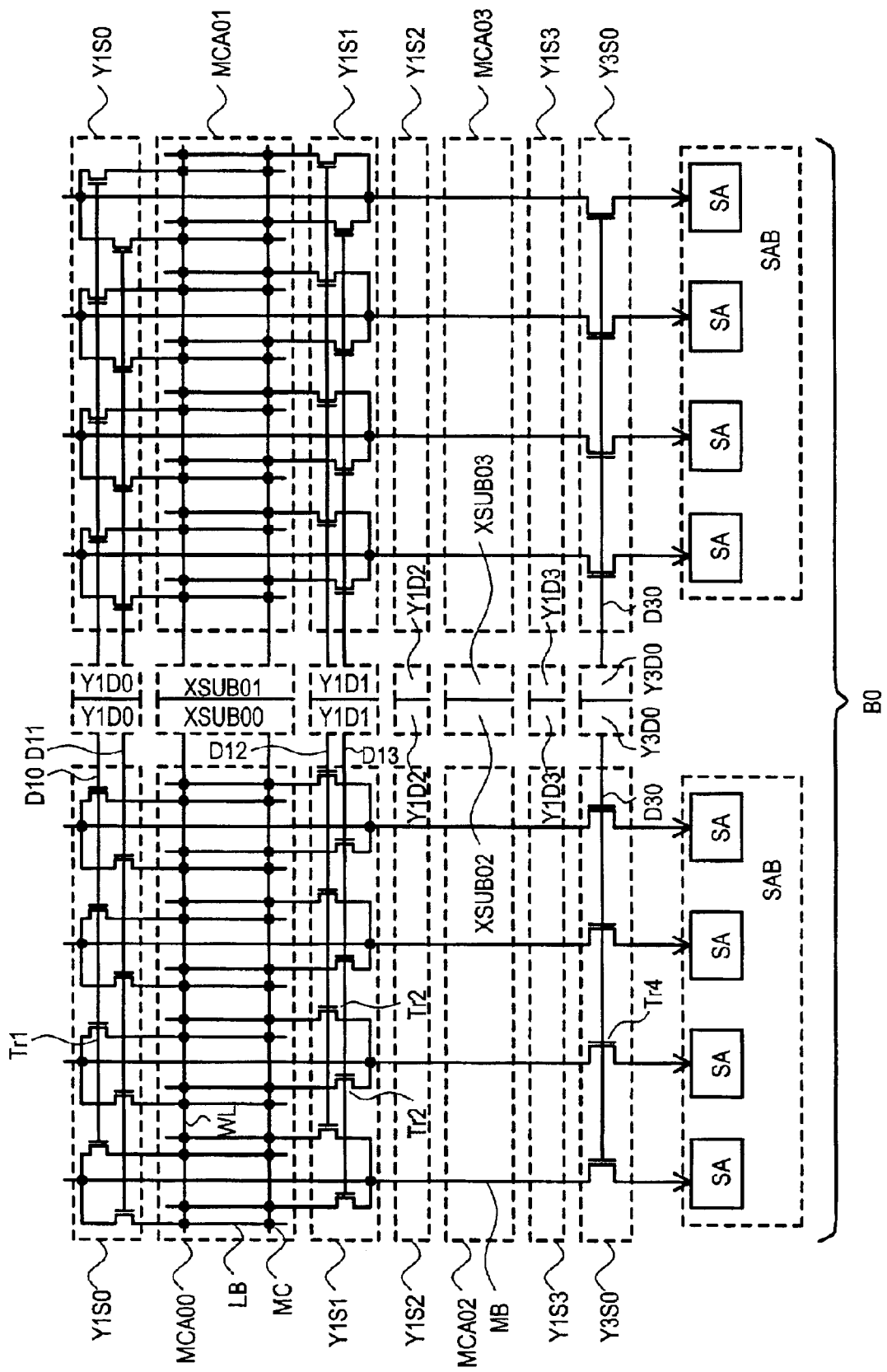
FIG. 10 is a circuit schematic diagram illustrating memory cell arrays of a bank in a conventional non-volatile flash memory.

FIG. 8 is a circuit schematic diagram illustrating various circuits in a bank B0 of a non-volatile flash memory 700 according to the third embodiment is set forth.

Referring now to FIGS. 7 and 8, in non-volatile flash memory 700, switch groups (Y2S0 and Y2S1) of non-volatile flash memory 100 may respectively be divided into four switch groups (Y2S00 to Y2S03 and Y2S10 to Y2S13). One of four switch groups (Y2S00 to Y2S03) may be located at an end of one of the memory cell arrays (MCA00 and MCA02). Each switch group (Y2S00 to Y2S03) may include transistors Tr3. In order to avoid unduly cluttering the figure, FIG. 8 only illustrates one transistor Tr3 in each switch group (Y2S00 to Y2S03), however, there may actually be 32 transistors Tr3 in each switch group (Y2S00 to Y2S03).

In switch group Y2S00, transistors Tr3 may be connected to the left most main bit line MB, and then to every fourth main bit line MB after that. For example, in switch group Y2S00, a transistor Tr3 may have a source/drain connected to a $1^{st}$, $5^{th}$, $9^{th}$, ..., $125^{th}$ main bit line MB. In switch group Y2S01, a transistor Tr3 may have a source/drain connected to a $2^{nd}$, $6^{th}$, $10^{th}$, ..., $126^{th}$ main bit line MB. In switch group Y2S02, a transistor Tr3 may have a source/drain connected to a $3^{rd}$, $7^{th}$, $11^{th}$, ..., $127^{th}$ main bit line MB. In switch group Y2S03, a transistor Tr3 may have a source/drain connected to a $4^{th}$, $8^{th}$, $12^{th}$, ..., $128^{th}$ main bit line MB.

Switch group Y2S00 may be arranged above switch group Y1S0 in a plan view. Switch group Y2S01 may be arranged below switch group Y1S1 in a plan view. Switch group Y2S02 may be arranged above switch group Y1S2 in a plan view. Switch group Y2S03 may be arranged below switch group Y1S3 in a plan view.

Also, in non-volatile flash memory 700, drivers (Y2D0 and Y2D1) of non-volatile flash memory 100 may respectively be divided into four drivers (Y2D00 to Y2D03 and Y2D10 to Y2D13). Transistors Tr3 in switch group Y2S00 may have gates connected to driver Y2D00. Transistors Tr3 in switch group Y2S01 may have gates connected to driver Y2D01. Transistors Tr3 in switch group Y2S02 may have gates connected to driver Y2D02. Transistors Tr3 in switch group Y2S03 may have gates connected to driver Y2D03. Likewise, transistors in respective switch groups (Y2S10 to Y2S13) may have gates connected to respective drivers (Y2D10 to Y2D13).

Drivers (Y2D00 to Y2D03) may receive group selecting signal GROUP0 and may be configured in a similar manner as driver Y2D0. Drivers (Y2D10 to Y2D13) may receive group selecting signal GROUP1 and may be configured in a similar manner as driver Y2D1. Group selecting signal GROUP0 may become active when memory cell array (MCA00–MCA02 or MCA10–MCA12) is selected. Group selecting signal GROUP1 may become active when any of memory cell arrays (MCA01–MCA03 or MCA11–MCA13) is selected.

As illustrated in FIG. 7, non-volatile flash memory 700 may include global bit lines GB. Global bit lines GB may be disposed over switch groups (Y2S00 to Y2S03 and Y2S10 to Y2S13) in a word line direction. Global bit lines GB may be formed in an upper conductive layer. A group (32 in this example) of global bit lines GB may be disposed over switch groups (Y2S00 and Y2S10). Each global bit line GB in the group may be connected to a source/drain of a transistor Tr3 in switch groups (Y2S00 and Y2S10). Another three groups of global bit lines GB may likewise disposed over switch groups (Y2S01–Y2S11, Y2S02–Y2S12, and Y2S03–Y2S13). In this way, global bit lines GB and switch groups (Y2S00–Y2S03 and Y2S10–Y2S13) may be distributed at edges of memory cell arrays (MCA00 to MCA03). It should be noted that in FIG. 8, global bit lines GB and switch groups (Y2S00–Y2S03 and Y2S10–Y2S13) are offset with respect to each other for illustration convenience. Furthermore, in non-volatile flash memory 700, switch groups (Y3S0 and Y3S1) of non-volatile flash memory 100 may respectively be divided into four switch groups (Y3S00 to Y3S03 and Y3S10 to Y3S13). Each switch groups (Y3S00 to Y3S03) may be located at an end a respective group of global bit lines GB. Each switch group (Y3S00 to Y3S03) may include transistors Tr4. In order to avoid unduly cluttering the figure, FIG. 8 only illustrates one transistor Tr4 in each switch group (Y3S00 to Y3S03), however, there may actually be 32 transistors Tr4 in each switch group (Y3S00 to Y3S03). Each transistor Tr4 may have a source/drain connected to a global bit line GB and another source/drain connected to a read sense amplifier block RSAB. Each transistor Tr4 may receive a decode signal from a driver (Y3D00 to Y3D03).

Also, in non-volatile flash memory 700, drivers (Y3D0 and Y3D1) of non-volatile flash memory 100 may respectively be divided into four drivers (Y3D00 to Y3D03 and Y3D10 to Y3D13). Transistors Tr4 in switch group Y3S00 may have gates connected to driver Y3D00. Transistors Tr4 in switch group Y3S01 may have gates connected to driver Y3D01. Transistors Tr4 in switch group Y3S02 may have gates connected to driver Y3D02. Transistors Tr4 in switch group Y3S03 may have gates connected to driver Y3D03. Likewise, transistors in respective switch groups (Y3S10 to Y3S13) may have gates connected to respective drivers (Y3D10 to Y3D13).

Drivers (Y3D00 to Y3D03) may receive bank selecting signal BANK0 and may be configured in a similar manner as driver Y3D0. Drivers (Y3D10 to Y3D13) may receive bank selecting signal BANK1 and may be configured in a similar manner as driver Y3D1. Bank selecting signal BANK0 may become active when any of memory cell arrays (MCA00 to MCA03) is selected. Bank selecting signal BANK1 may become active when any of memory cell arrays (MCA10 to MCA13) is selected.

Each read sense amplifier block RSAB may include 64 read sense amplifiers. One read sense amplifier block RSAB may be disposed between main X decoders (XDEC10 and XDEC12) and another read sense amplifier block RSAB may be disposed between main X decoders (XDEC11 and XDEC13). As illustrated in FIG. 8, read sense amplifier blocks RSAB may be divided into two groups (an upper group and a lower group) of 32 read sense amplifiers. Read sense amplifiers may be arranged in a row.

Each transistor Tr4 from a switch group (Y3S00 to Y3S03) from bank B0 may have a source/drain commonly connected with a corresponding transistor from a switch group (Y3S10 to Y3S13) from bank B1 at an input to a read sense amplifier block RSAB. In this way, a read sense amplifier block RSAB may be commonly used by banks (B0 and B1).

Non-volatile flash memory 700 may include four write/erase amplifier blocks VSAB. Each write/erase amplifier block VSAB may include eight write/erase amplifiers. A write/read amplifier block VSAB may be located adjacent to a main X decoder (XDEC10 to XDEC13).

Because switch groups (Y2S00 to Y2S03 and Y2S10 to Y2S13) may be enabled by drivers (Y2D00 to Y2D03 and Y2D10 to Y2D13) according to group selecting signals (GROUP0 and GROUP1) and switch groups (Y3S00 to Y3S03 and Y3S10 to Y3S13) may be enabled by drivers (Y3D00 to Y3D03 and Y3D10 to Y3D13) according to bank selecting signals (BANK0 and BANK1), a global bit line GB may never be simultaneously connected to a plurality of main bit lines MB. In this way, a normal data read operation may be performed.

Because each bank (B0 and B1) may be provided with write/erase amplifiers, it may be possible to perform data erase or write operation in one bank (B0 or B1) while performing a data read operation from the other bank (B0 or B1).

Furthermore, because global bit lines GB may be disposed over switch groups (Y2S00–Y2S10, Y2S01–Y2S11, Y2S02–Y2S12, and Y2S03–Y2S13), an area dedicated to global bit lines GB may not be needed. Also, in non-volatile flash memory 700 read sense amplifier blocks RSAB and write/erase amplifier blocks VSAB may be arranged between banks (B0 and B1) as opposed to non-volatile flash memories (100 and 600). By arranging read sense amplifier blocks RSAB and write/erase amplifier blocks VSAB between banks (B0 and B1), layout freedom in a bit line direction may be improved.

On the other hand, by arranging read sense amplifier blocks RSAB and write/erase amplifier blocks VSAB between banks (B0 and B1), layout area in this region for such a circuit is required. However, because of the division of global bit lines GB into groups, only 32 sense amplifiers SA may be arranged in parallel in a read sense amplifier block RSAB. Also, in this case, only 32 global bit lines GB may be required to be arranged over sense amplifiers SA in a sense amplifier block RSAB. This may allow global bit lines GB to be more efficiently routed over circuitry and reduce a need for dedicated signal routing channels. By doing so, layout efficiency in a bit line direction may be improved.

Transistors (Tr1, Tr2, Tr3, and Tr4) may be insulated gate field effect transistors (IGFETs). Transistors (Tr1, Tr2, Tr3, and Tr4) may be n-type IGFETs or p-type IGFETs as just two examples.

As has been described above, according to the present embodiments, a main bit line selecting circuit may enable each n main bit lines provided in the same memory cell array to be connected to a sense amplifier. The sense amplifier may be selectively connected to n main bit lines provided in other memory cell arrays. Accordingly, the necessity of providing the same number of sense amplifiers as main bit lines may be eliminated. Thus, layout freedom may be improved and chip size may be reduced. A global bit line may be formed over a main bit line selecting circuit and sense amplifiers may be arranged between memory banks. In this way, layout freedom in a sub bit line direction may be improved.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A non-volatile semiconductor memory device, comprising:
   a plurality of first main bit lines and a plurality of second main bit lines;
   a plurality of first sub bit line groups, each first sub bit line group including a plurality of first sub bit lines corresponding to one of the plurality of first main bit lines;
   a plurality of second sub bit line groups, each second sub bit line group including a plurality of second sub bit lines corresponding to one of the plurality of second main bit lines;

each of the first sub bit lines and second sub bit lines are connected to a plurality of memory cells;

a first global bit line coupled to one of the first main bit lines and to one of the second main bit lines;

a second global bit line coupled to another one of the first main bit lines and another one of the second main bit lines;

a first sense amplifier coupled to the first global bit line; and a second sense amplifier coupled to the second global bit line.

2. The non-volatile semiconductor memory device according to claim 1, wherein:

the plurality of first and second main bit lines are disposed in a first direction;

the first and second global bit lines are disposed in a second direction and separated by at least the plurality of first sub bit line groups; and the first and second sense amplifiers are arranged in the first direction.

3. The non-volatile semiconductor memory device according to claim 2, further including:

the first direction is orthogonal to the second direction;

a first connection transistor providing an electrical connection between the one of the first main bit lines and the first global bit line; and a second connection transistor providing an electrical connection between the another one of the first main bit lines and the second global bit line wherein the first connection transistor is separated by at least one of the plurality of memory cells in the first direction from the second connection transistor.

4. The non-volatile semiconductor memory device according to claim 3, wherein:

the first and second connection transistors are insulated gate field effect transistors (IGFETs).

5. A non-volatile semiconductor memory device, comprising:

a first and second bank, each of the first and second bank includes a first and second memory cell array;

each of the first and second memory cell arrays include a plurality of sub bit lines arranged in a plurality of groups of sub bit lines;

a plurality of main bit lines are disposed over each of the first and second memory cell arrays, each one of the plurality of main bit lines is coupled to one of the plurality of groups of sub bit lines by a sub bit line selecting circuit; and each one of the plurality of main bit lines is coupled to one of a plurality of sense amplifiers by a main bit line selecting circuit wherein one of the plurality of main bit lines disposed over the first memory cell array in the first bank is coupled to a same one of the plurality of sense amplifiers as one of the plurality of main bit lines disposed over the second memory cell array in the first bank.

6. The non-volatile semiconductor memory device according to claim 5, wherein:

the non-volatile semiconductor memory device is a flash memory including at least one erase circuit.

7. The non-volatile semiconductor memory device according to claim 5, wherein:

the main bit line selection circuit includes a group selection circuit and a bank selection circuit coupled in series between the each one of the plurality of main bit lines and the one of the plurality of sense amplifiers.

8. The non-volatile semiconductor memory device according to claim 7, wherein:

the bank selection circuit and group selection circuit are responsive to at least a portion of an address received by the non-volatile semiconductor memory device.

9. The non-volatile semiconductor memory device according to claim 8, wherein:

the bank selection circuit includes a first insulated gate field effect transistor (IGFET) and the group selection circuit includes a second IGFET; and the first and second IGFETs are coupled in series to provide a controllable impedance path between the each one of the plurality of main bit lines and the one of the plurality of sense amplifiers.

10. A non-volatile semiconductor memory device according to claim 5, wherein:

the one of the plurality of main bit lines disposed over the first memory cell array in the first bank is coupled to the same one of the plurality of sense amplifiers as one of the plurality of main bit lines disposed over the first memory cell array in the second bank and one of the plurality of main bit lines disposed over the second memory cell array in the second bank.

11. The non-volatile semiconductor memory device according to claim 10, wherein:

a global bit line commonly coupled to the one of the plurality of main bit lines disposed over the first memory cell array in the first bank, the one of the plurality of main bit lines disposed over the second memory cell array in the first bank, the one of the plurality of main bit lines disposed over the first memory cell array in the second bank, and the one of the plurality of main bit lines disposed over the second memory cell array in the second bank.

12. The non-volatile semiconductor memory device according to claim 10, wherein:

the plurality of sense amplifiers are disposed between the first and second banks.

* * * * *